US007317507B2

(12) United States Patent
Straaijer

(10) Patent No.: US 7,317,507 B2
(45) Date of Patent: Jan. 8, 2008

(54) LITHOGRAPHIC APPARATUS AND DEVICE MANUFACTURING METHOD

(75) Inventor: Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 21 days.

(21) Appl. No.: 11/120,198

(22) Filed: May 3, 2005

(65) Prior Publication Data
US 2006/0250591 A1   Nov. 9, 2006

(51) Int. Cl.
G03B 27/42   (2006.01)
G03B 27/58   (2006.01)
(52) U.S. Cl. .......................................... 355/53; 355/72
(58) Field of Classification Search .................. 355/53, 355/72, 75
See application file for complete search history.

(56) References Cited

U.S. PATENT DOCUMENTS

| 3,573,975 | A | 4/1971 | Dhaka et al. ............... 117/212 |
| 3,648,587 | A | 3/1972 | Stevens .......................... 95/44 |
| 4,346,164 | A | 8/1982 | Tabarelli et al. ............ 430/311 |
| 4,390,273 | A | 6/1983 | Loebach et al. ............. 355/125 |
| 4,396,705 | A | 8/1983 | Akeyama et al. ........... 430/326 |
| 4,480,910 | A | 11/1984 | Takanashi et al. ............ 355/30 |
| 4,509,852 | A | 4/1985 | Tabarelli et al. .............. 355/30 |
| 5,040,020 | A | 8/1991 | Rauschenbach et al. ...... 355/53 |
| 5,121,256 | A | 6/1992 | Corle et al. .................. 359/664 |
| 5,610,683 | A | 3/1997 | Takahashi ...................... 355/53 |
| 5,825,043 | A | 10/1998 | Suwa .......................... 250/548 |
| 5,900,354 | A | 5/1999 | Batchelder .................. 430/395 |
| 6,191,429 | B1 | 2/2001 | Suwa .......................... 250/548 |
| 6,236,634 | B1 | 5/2001 | Lee et al. .................... 369/112 |
| 6,600,547 | B2 | 7/2003 | Watson et al. ................. 355/30 |

(Continued)

FOREIGN PATENT DOCUMENTS

DE   206 607   2/1984

(Continued)

OTHER PUBLICATIONS

European Search Report for EP Application No. 06252280.0 dated Oct. 5, 2006.

(Continued)

Primary Examiner—Peter B. Kim
Assistant Examiner—Marissa A. Ohira
(74) Attorney, Agent, or Firm—Pillsbury Winthrop Shaw Pittman LLP

(57) ABSTRACT

A lithographic projection apparatus uses a volume of a second liquid to confine a first liquid to a space between the projection system and the substrate. In an embodiment, the first and second liquids are substantially immiscible and may be a cycloalkane, such as cyclooctane, decalin, bicyclohexyl, exo-tetrahydro-dicyclopentadiene and cyclohexane, another high-index hydrocarbon, a perfluoropolyether, such as perfluoro-N-methylmorpholine and perfluoro E2, a perfluoroalkane, such as perfluorohexane, or a hydrofluoroether; and water, respectively.

24 Claims, 3 Drawing Sheets

U.S. PATENT DOCUMENTS

| | | | |
|---|---|---|---|
| 6,603,130 | B1 | 8/2003 | Bisschops et al. ........ 250/492.1 |
| 2002/0020821 | A1 | 2/2002 | Van Santen et al. ........ 250/492 |
| 2002/0163629 | A1 | 11/2002 | Switkes et al. ............... 355/53 |
| 2003/0123040 | A1 | 7/2003 | Almogy ....................... 355/69 |
| 2004/0000627 | A1 | 1/2004 | Schuster ................. 250/201.2 |
| 2004/0075895 | A1 | 4/2004 | Lin ............................ 359/380 |
| 2004/0114117 | A1 | 6/2004 | Bleeker ....................... 355/53 |
| 2004/0136494 | A1 | 7/2004 | Lof et al. ...................... 378/34 |
| 2004/0160582 | A1 | 8/2004 | Lof et al. ...................... 355/30 |
| 2004/0165159 | A1 | 8/2004 | Lof et al. ...................... 355/30 |
| 2004/0207824 | A1 | 10/2004 | Lof et al. ...................... 355/30 |
| 2004/0211920 | A1 | 10/2004 | Derksen et al. .......... 250/492.1 |
| 2004/0239954 | A1 | 12/2004 | Bischoff ..................... 356/635 |
| 2004/0253547 | A1 | 12/2004 | Endo et al. |
| 2004/0263809 | A1 | 12/2004 | Nakano ....................... 355/30 |
| 2005/0007569 | A1 | 1/2005 | Streefkerk et al. ............ 355/30 |
| 2005/0018155 | A1 | 1/2005 | Cox et al. ..................... 355/30 |
| 2005/0024609 | A1 | 2/2005 | De Smit et al. .............. 355/18 |
| 2005/0030497 | A1 | 2/2005 | Nakamura ................... 355/30 |
| 2005/0046813 | A1 | 3/2005 | Streefkerk et al. ............ 355/30 |
| 2005/0046934 | A1 | 3/2005 | Ho et al. ..................... 359/380 |
| 2005/0052632 | A1 | 3/2005 | Miyajima .................... 355/53 |
| 2005/0094116 | A1* | 5/2005 | Flagello et al. ............... 355/53 |
| 2005/0094119 | A1* | 5/2005 | Loopstra et al. .............. 355/67 |
| 2005/0094125 | A1 | 5/2005 | Arai ............................ 355/72 |
| 2005/0122505 | A1 | 6/2005 | Miyajima .................... 355/72 |
| 2005/0132914 | A1 | 6/2005 | Mulkens et al. .......... 101/463.1 |
| 2005/0134817 | A1 | 6/2005 | Nakamura ................... 355/53 |
| 2005/0140948 | A1 | 6/2005 | Tokita ......................... 355/30 |
| 2005/0146693 | A1 | 7/2005 | Ohsaki ........................ 355/30 |
| 2005/0146694 | A1 | 7/2005 | Tokita ......................... 355/30 |
| 2005/0151942 | A1 | 7/2005 | Kawashima ................. 355/30 |
| 2005/0200815 | A1 | 9/2005 | Akamatsu .................... 353/53 |
| 2005/0213065 | A1 | 9/2005 | Kitaoka ....................... 355/53 |
| 2005/0213066 | A1 | 9/2005 | Sumiyoshi ................... 355/53 |
| 2005/0219489 | A1 | 10/2005 | Nei et al. ..................... 355/53 |
| 2005/0233081 | A1 | 10/2005 | Tokita ........................ 427/256 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 489 462 | 12/2004 |
| EP | 1 498 778 | 1/2005 |
| EP | 1 531 362 | 5/2005 |
| EP | 1 557 721 | 7/2005 |
| EP | 1 598 855 | 11/2005 |
| EP | 1 632 991 | 3/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO99/49504 | 9/1999 |
| WO | WO2003/077034 | 9/2003 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |
| WO | WO2005/029559 | 3/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 µm Fine Patterns Using Optcial Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Peformance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

* cited by examiner

Fig. 2
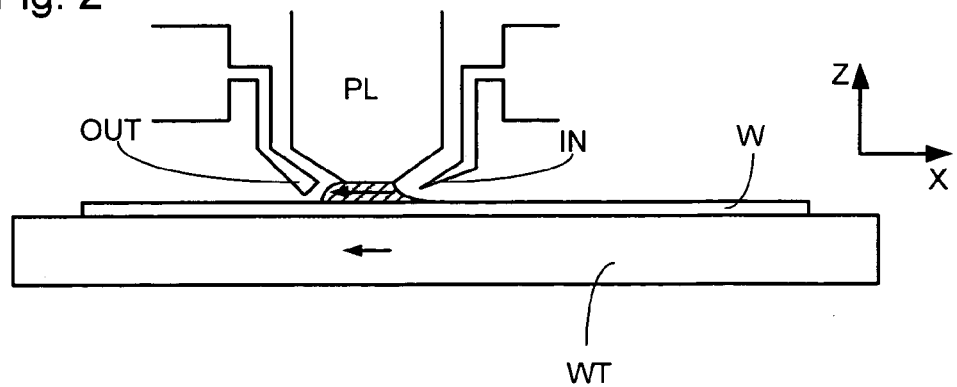
Fig. 3
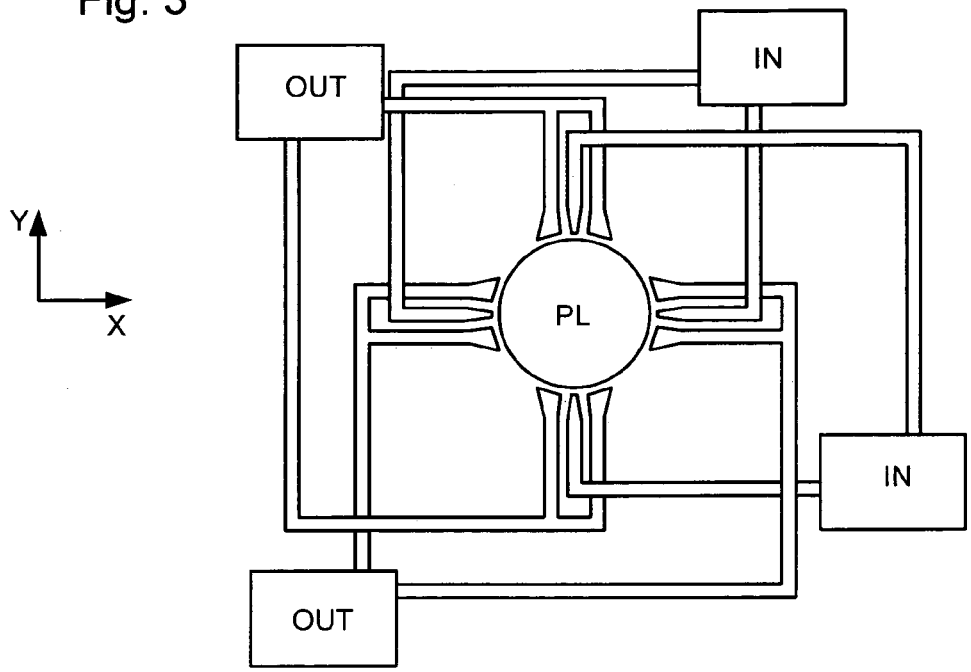
Fig. 4
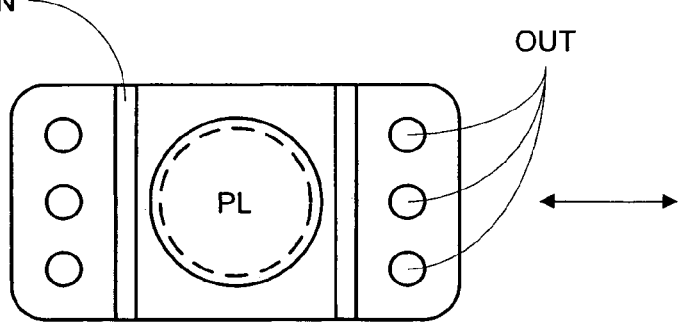
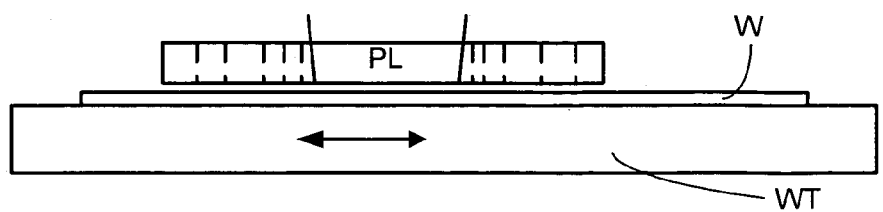

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as enabling the use of a larger effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The advantage provided by immersion lithography is dependent upon the refractive index of the immersion liquid—the higher the refractive index, the greater the benefit. Most existing proposals have used ultra pure water, which has a refractive index of 1.437 at 193 nm, as the immersion fluid but other fluids with higher refractive indexes have also been proposed. These include certain hydro-carbons that have a refractive index of greater than 1.6 at 193 nm, and certain perfluoropolyethers, which have a refractive index greater than 1.3 at 157 nm. Although these liquids are possibly suitable for immersion lithography—for example, they have good stability, transmissivity and are compatible with projection system materials and resists—their fluid properties are very different than those of water and so existing designs of liquid containment system may not effectively localize these fluids between the projection system and the substrate. These fluids are nonpolar and have very low surface tension so they easily spread out across the entire substrate and substrate table. Arrangements using gas knives that have been shown to successfully confine water, may not be able to confine these nonpolar fluids.

Accordingly, it would advantageous, for example, to provide an immersion lithographic apparatus capable of localizing a nonpolar, low-surface tension liquid, e.g. to a space between the projection system and the substrate.

According to an aspect of the invention, there is provided a lithographic projection apparatus, comprising:

a projection system configured to project a patterned radiation beam onto a target portion of a substrate; and a liquid supply system configured to supplying a first liquid to a space between the projection system and the substrate, the liquid supply system comprising:

a liquid confinement structure substantially surrounding the space and adapted to confine a liquid to a volume around the space;

a first liquid supply arranged to supply the first liquid to the space; and a second liquid supply arranged to supply a second liquid to the volume.

According to a further aspect of the invention, there is provided a device manufacturing method comprising projecting an image of a pattern through a liquid onto a target portion of a substrate using a projection system, wherein the liquid is confined to a space between the projection system and the substrate by a volume of another liquid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
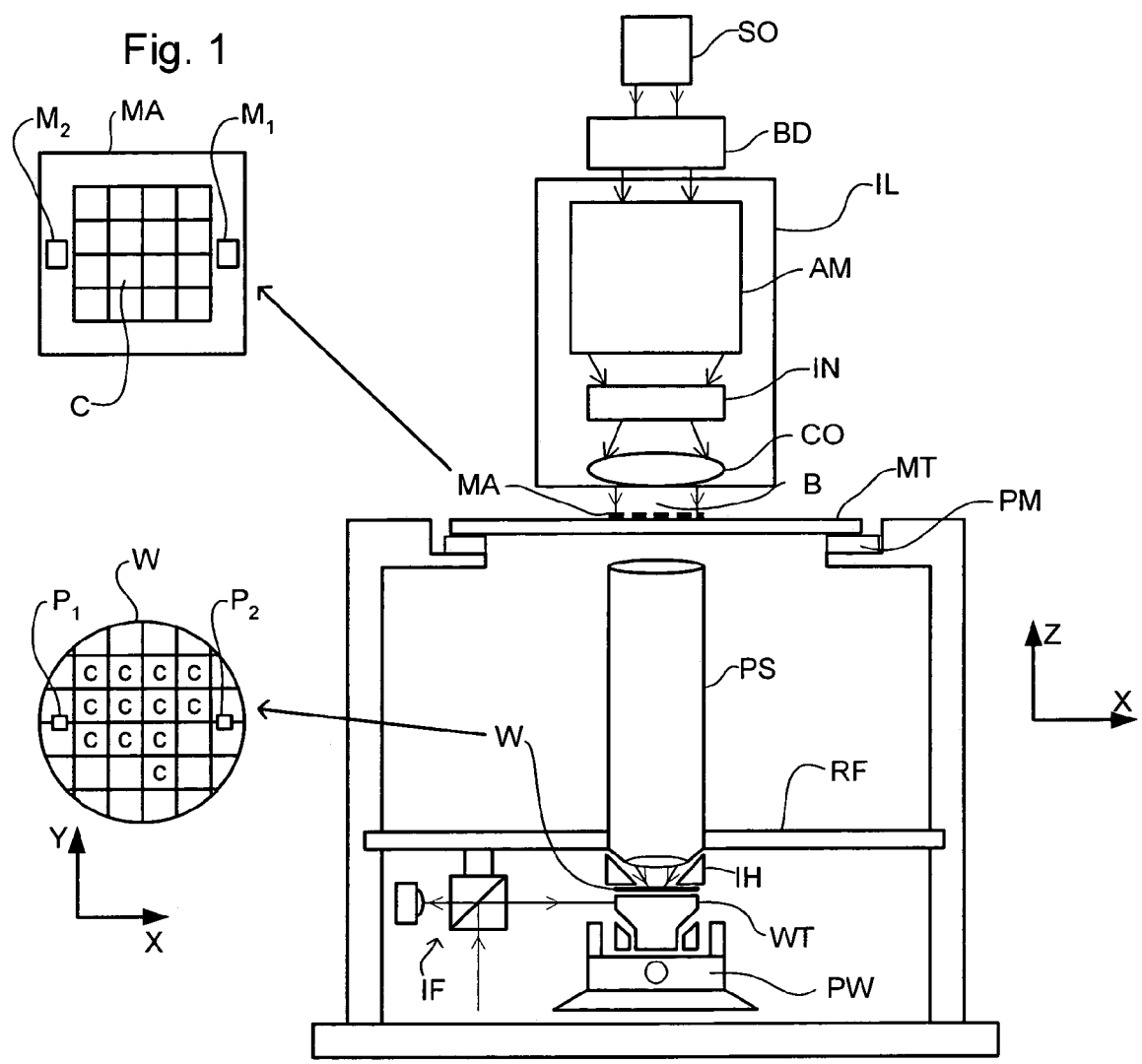
FIG. 1 depicts a lithographic apparatus according to an embodiment of the invention.

FIG. 1 schematically depicts a lithographic apparatus according to an embodiment of the invention. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a shortstroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
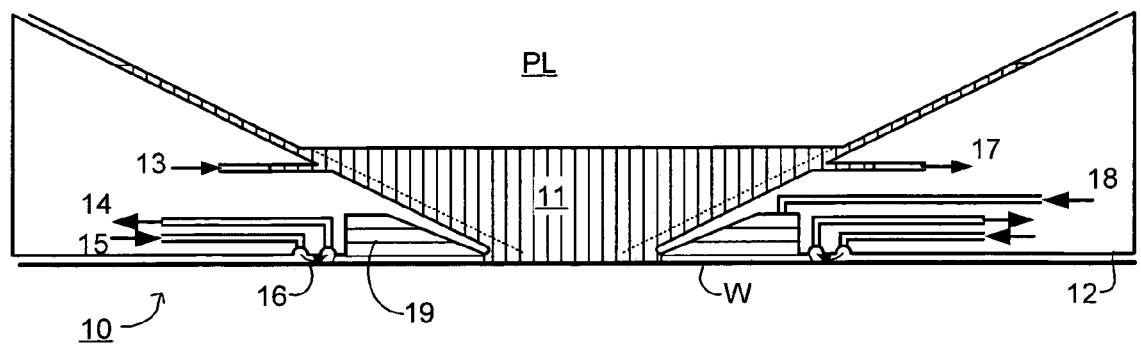
FIG. 5 depicts in cross-section the final element of a projection system and a liquid supply system in a lithographic apparatus according to an embodiment of the present invention.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. In an embodiment, the seal is a contactless seal such as a gas seal. Such a system is disclosed in United States patent application publication no. US 2004-0207824 and European patent application publication no. EP 1420298, each hereby incorporated in its entirety by reference, and illustrated in FIG. 5.

As shown in FIG. 5, a liquid supply system is used to supply liquid to the space between the final element of the projection system and the substrate. The reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. A first liquid 11 is brought into the space below the projection system and within the liquid confinement structure 12 through supply 13 and removed by exhaust 17. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery may be circular or closely conform to the shape of the image field, e.g., rectangular.

The first liquid 11 is confined in the reservoir by a second liquid 19, with which it is substantially immiscible, that is supplied via supply 18. The second liquid 19 is confined by a gas seal 16 between the bottom of the liquid confinement structure 12 and the surface of the substrate W. The gas seal is formed by gas, e.g. air, synthetic air, N2 or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. Other arrangements to confine a liquid while the body of liquid is moved over a substrate or the substrate is moved relative to the body of liquid are known and may be used to confine the second liquid and therefore also the first liquid.

The first, or immersion, liquid is primarily selected on the basis of its optical properties, significantly its refractive index at the wavelength of the exposure radiation. Other useful properties of the second liquid are compatibility with the material of the final projection system element and with the resist, transmissivity and stability over time and under irradiation. However deficiencies in these properties can in many cases be ameliorated by a coating on the final projection system element and/or the resist, by increasing the power of the radiation source and/or by increasing the refresh rate of the second liquid. Suitable compounds for the first liquids are cycloalkanes, such as cyclooctane, decalin, bicyclohexyl, exo-tetrahydro-dicyclopentadiene and cyclohexane, other high-index hydrocarbons, perfluoropolyethers, such as perfluoro-N-methylmorpholine and Perfluoro E2, perfluoroalkanes, such as perfluorohexane, and hydrofluoroethers.

For the second, or confining, liquid, significant fluid properties are those that enable it to be confined, such as surface tension, viscosity and interaction with surfaces of the liquid confinement structure, and its immiscibility with the second liquid. A suitable compound for the second liquid is water. Although a high refractive index is desirable, this and other optical properties of the liquid are relatively unimportant so that additives that increase the desirable properties of the first liquid can be chosen quite freely.

In an embodiment, the two liquids are substantially immiscible and the functioning may be improved the less miscible are the two liquids. A sufficient degree of immiscibility can be obtained by selecting a non-polar liquid as the first liquid and a polar liquid as the second liquid. If the refractive index of the first and second liquids are not too different, a substantial amount of intermixing can be tolerated. For example, with water (refractive index 1.437) and a hydro-carbon of refractive index greater than 1.6, 1% by volume of water mixed with the hydrocarbon will only reduce the refractive index by only about 1 part in 1000.

Figure 6:
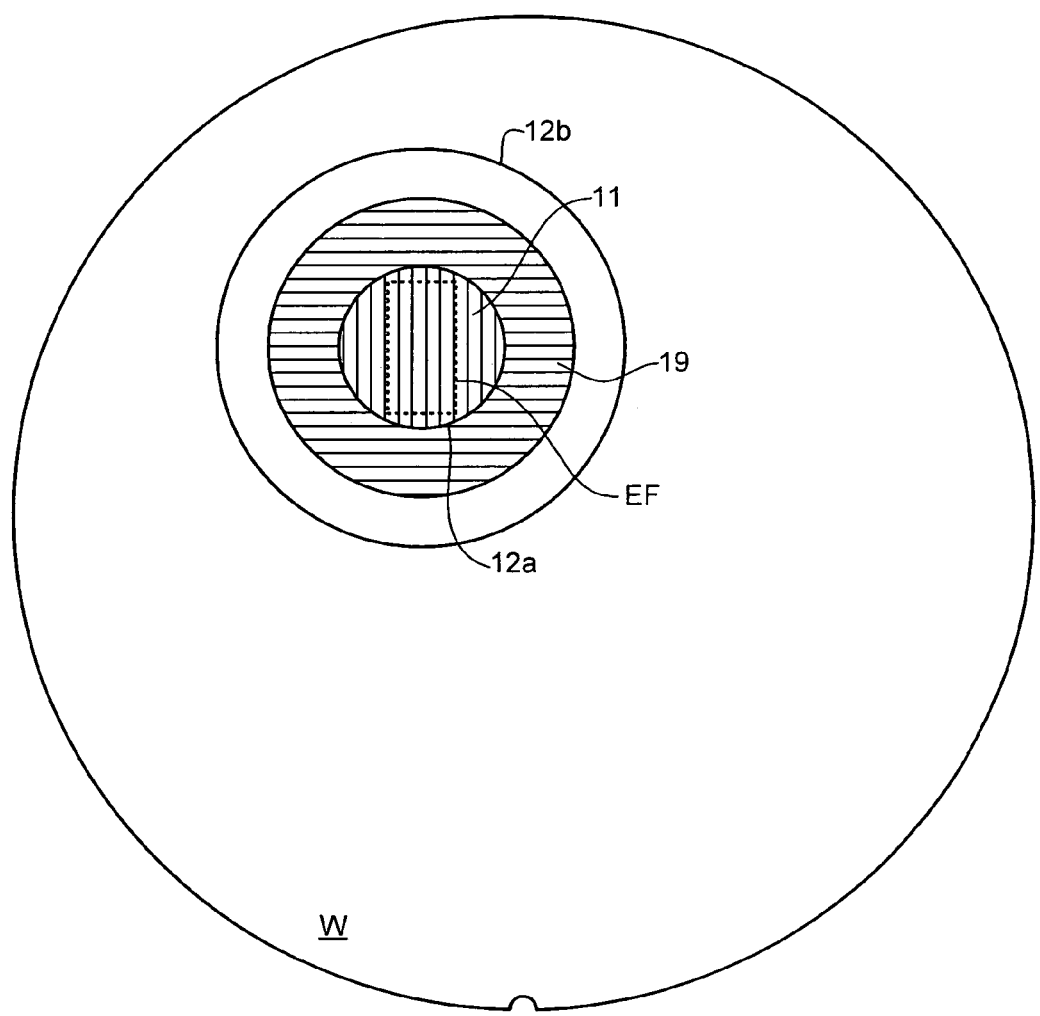
FIG. 6 depicts in plan the liquid supply system of FIG. 5.

The liquid confinement arrangement of this embodiment can be appreciated more clearly from FIG. 6 which shows in plan, the outlines of the exposure field EF, the inner periphery 12a of the liquid confinement structure 12, the extent of the second liquid 19 and the outer periphery 12b of the liquid confinement structure 12. The inner periphery of the liquid confinement structure 12a may be shaped, textured and or provided with coatings to stabilize the interface between the first and second liquids. For example, where the first liquid is non-polar and the second liquid is water, a hydrophilic coating may be provided on the surface of the liquid confinement structure facing the substrate and a hydrophobic coating on the surface of the liquid confinement structure facing the space between the final element of the projection system and the substrate.

Although water-related terms such as hydrophilic, hydrophobic, humidity, etc. may be used herein, these terms should be understood to encompass the similar properties for other liquids.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
    a projection system configured to project a patterned radiation beam onto a target portion of a substrate; and
    a liquid supply system configured to supply a first liquid to a space between the projection system and the substrate, the liquid supply system comprising:
        a liquid confinement structure substantially surrounding the space and adapted to confine a liquid to a volume around the space;
        a first liquid supply arranged to supply the first liquid to the space; and
        a second liquid supply arranged to supply a second liquid, to the volume, to at least partly confine the first liquid within the space, the second liquid having a different composition from the first liquid.

2. The apparatus according to claim 1, wherein the first liquid is substantially immiscible in the second liquid.

3. The apparatus according to claim 2, wherein the first liquid is non-polar and the second liquid is polar.

4. The apparatus according to claim 3, wherein the first liquid is selected from the group comprising: cycloalkane, other high-index hydrocarbon, perfluoropolyether, perfluoroalkane, and hydrofluoroether; and the second liquid comprises water.

5. The apparatus according to claim 1, wherein the first liquid is selected from the group comprising: cyclooctane, decalin, bicyclohexyl, exo-tetrahydro-dicyclopentadiene and cyclohexane.

6. The apparatus according to claim 1, wherein the first liquid is perfluoro-N-methylmorpholine or perfluoro E2.

7. The apparatus according to claim 1, wherein the first liquid is perfluorohexane.

8. The apparatus according to claim 1, wherein the liquid confinement structure has a hydrophilic surface bordering the volume and a hydrophobic surface bordering the space.

9. The apparatus according to claim 1, wherein the volume is between the liquid confinement structure and the substrate.

10. The apparatus according to claim 1, wherein the volume is annular.

11. The apparatus according to claim 1, wherein the second liquid is in contact with the first liquid.

12. The apparatus according to claim 1, configured to project patterned radiation beam through the first liquid onto the target portion without substantially passing through the second liquid.

13. A device manufacturing method comprisinging:
projecting an image of a pattern through a first liquid onto a target portion of a substrate using a projection system, and
at least partly confining the first liquid to a space between the projection system and the substrate by a volume of a second liquid, the second liquid having a different composition from the first liquid.

14. The method according to claim 13, wherein the first liquid is substantially immiscible in the second liquid.

15. The method according to claim 14, wherein the first liquid is non-polar and the second liquid is polar.

16. The method according to claim 15, wherein the first liquid is selected from the group comprising: cycloalkane, other high-index hydrocarbon, perfluoropolyether, perfluoroalkane, and hydrofluoroether; and the second liquid comprises water.

17. The method according to claim 13, wherein the first liquid is selected from the group comprising: cyclooctane, decalin, bicyclohexyl, exo-tetrahydro-dicyclopentadiene and cyclohexane.

18. The method according to claim 13, wherein the first liquid is perfluoro-N-methylmorpholine or perfluoro E2.

19. The method according to claim 13, wherein the first liquid is perfluorohexane.

20. The method according to claim 13, wherein the first liquid is confined to the space using at least in part a liquid confinement structure, the liquid confinement structure having a hydrophilic surface bordering the volume and a hydrophobic surface bordering the space.

21. The method according to claim 13, wherein the volume is between the substrate and a liquid confinement structure used at least part in part to confine the first liquid in the space.

22. The method according to claim 13, wherein the volume is annular.

23. The method according to claim 13, wherein the second liquid is in contact with the first liquid.

24. A lithographic projection apparatus, comprising:
a projection system configured to project a patterned radiation beam onto a target portion of a substrate; and
a liquid supply system configured to supply a first liquid to a space that extends between the projection system and the substrate, the liquid supply system comprising
a liquid confinement structure substantially surrounding the space;
a first liquid supply arranged to supply the first liquid to the space; and
a second liquid supply arranged to supply a second liquid to confine the first liquid within the space such that, in use, the first liquid remains substantially in contact with a final lens of the projection system and the substrate, the second liquid having a different composition from the first liquid.

* * * * *